(12) United States Patent
Matsui (10) Patent No.: US 6,300,803 B1
(45) Date of Patent: Oct. 9, 2001

(54) PHASE-COMPARISON CIRCUIT (75) Inventor: Naohiro Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/488,618

(22) Filed: Jan. 20, 2000

(30) Foreign Application Priority Data

Jan. 21, 1999 (JP) .................................................. 11-012728

(51) Int. Cl.[7] .................................................. H03D 13/00
(52) U.S. Cl. .............................. 327/3; 327/236; 327/359; 327/563; 330/252
(58) Field of Search ................................. 327/2, 3, 7, 12, 327/563, 355–357, 359, 236; 330/252, 257; 348/505; 331/25, 27; 375/375

(56) References Cited

U.S. PATENT DOCUMENTS

| | | | |
|---|---|---|---|
| 3,730,982 | * | 5/1973 | Nimi et al. ............................ 348/505 |
| 3,838,262 | * | 9/1974 | Van De Plassche ................ 327/357 |
| 4,870,303 | * | 9/1989 | McGinn .................................... 327/3 |

FOREIGN PATENT DOCUMENTS

| | | | |
|---|---|---|---|
| 57-206107 | 12/1982 | (JP) | ................................ H03F/3/343 |
| 61-12106 | 1/1986 | (JP) | ................................ H03D/13/00 |
| 6174405 | 4/1986 | (JP) | . |
| 62291210 | 12/1987 | (JP) | . |
| 63164603 | 7/1988 | (JP) | . |
| 9162721 | 6/1997 | (JP) | . |
| 9-298429 | 11/1997 | (JP) | ................................ H03F/3/45 |
| 10145154 | 5/1998 | (JP) | . |
| 11-145740 | 5/1999 | (JP) | ................................ H03F/3/343 |

* cited by examiner

*Primary Examiner*—Timothy P. Callahan
*Assistant Examiner*—Minh Nguyen
(74) *Attorney, Agent, or Firm*—Hayes, Soloway, Hennessey, Grossman & Hage, PC (57) ABSTRACT

A phase-comparison circuit includes (a) a first PNP transistor, (b) a second PNP transistor, (c) a third NPN transistor electrically connected to both a collector of the first PNP transistor and a base of the second PNP transistor, and (d) a constant current source electrically connected to an emitter of the third NPN transistor. The phase comparison circuit compensates for an offset current between a reference current and an output current, and as a result, can properly operate at a low voltage.

9 Claims, 8 Drawing Sheets

PHASE-COMPARISON CIRCUIT

BACKGROUND OF THE INVENTION

1. Field of the Invention

The invention relates to a phase-comparison circuit converting two voltage signals into current signals in accordance with a difference in phase between those two voltage signals.

2. Description of the Related Art

There have been suggested many current mirror circuits, for instance, as suggested in Japanese Unexamined Patent Publications Nos. 61-74405, 62-291210 and 10-145154.

Figure 1:
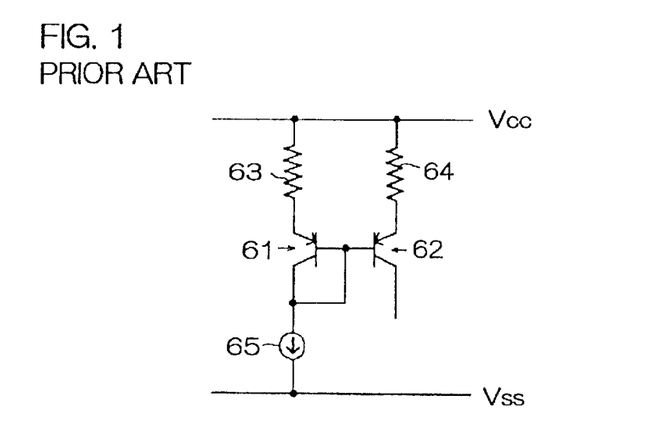
FIG. 1 is a circuit diagram of a first example of a conventional current mirror circuit.
Figure 2:
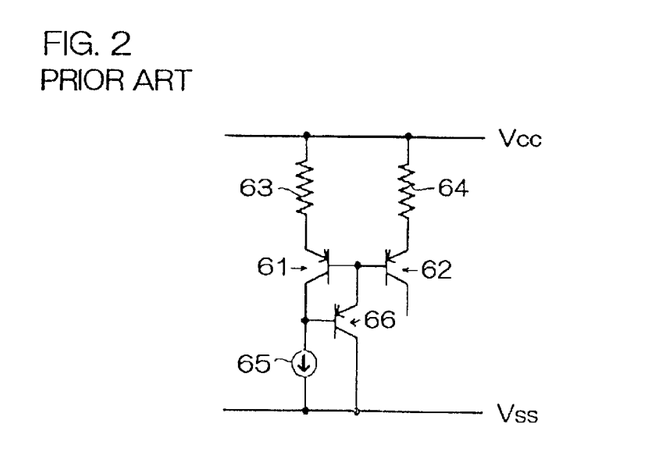
FIG. 2 is a circuit diagram of a second example of a conventional current mirror circuit.
Figure 3:
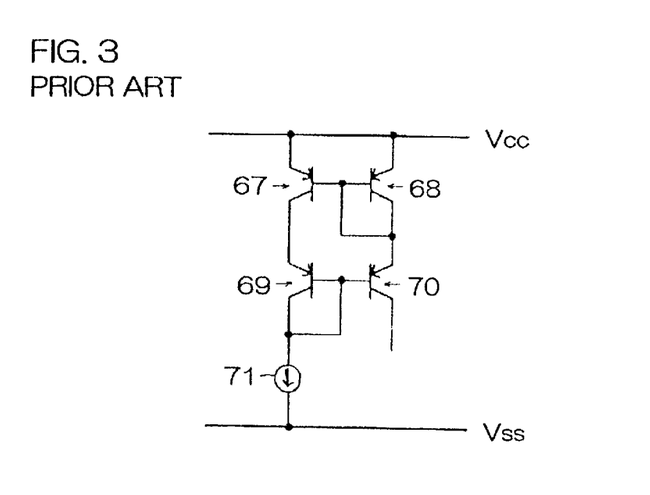
FIG. 3 is a circuit diagram of a third example of a conventional current mirror circuit.

An example of a conventional current mirror circuit is illustrated in FIGS. 1 to 3.

A current mirror circuit illustrated in FIG. 1 is comprised of a first PNP transistor 61, a second PNP transistor 62 having a base electrically connected to a base of the first PNP transistor 61, a first resistor 63 electrically connected to an emitter of the first PNP transistor 61, a second resistor 64 electrically connected to an emitter of the second PNP transistor 62, and a reference current source 65 electrically connected to a collector of the first PNP transistor 61. A base is shortcircuited to a collector in the first PNP transistor 61.

The current mirror circuit has an advantage that it can operate even at a low voltage, but is accompanied with a problem that a base current in both the first and second PNP transistors 61 and 62 acts as an error current, resulting in poor efficiency in conversion of a current mirror output current. That is, when amplification factors A of the first and second PNP transistors 61 and 62 are low, a current mirror output current supplied from a collector of the second PNP transistor 62 is not coincident with a reference current supplied from the reference current source 65.

The current mirror circuit illustrated in FIG. 1 is accompanied further with a problem that if a voltage between a collector and a base in the second PNP transistor 62 is increased, an error in conversion of a current mirror output current would be increased due to Early effect. If the first and second resistors 63 and 64 are designed to have greater values in order to prevent the current mirror circuit from being influenced by Early effect, there is posed another problem that the current mirror circuit cannot operate at a low voltage.

FIG. 2 illustrates another current mirror circuit having been suggested for the purpose of enhancing a current conversion efficiency caused by a base current in the current mirror circuit illustrated in FIG. 1.

In the current mirror circuit illustrated in FIG. 2, a third PNP transistor 66 is electrically connected across a base and a collector of the first PNP transistor 61 in place of the arrangement illustrated in FIG. 1 wherein a base and a collector are shortcircuited to each other in the first PNP transistor 61.

The addition of the third PNP transistor 66 causes a base current in the first and second PNP transistors 61 and 62 to be almost equal to $1/A^2$. Since this base current flows through the reference current source 65, it is possible to reduce a conversion error in a current mirror current.

However, the current mirror circuit illustrated in FIG. 2 is accompanied with a problem that two PNP transistors 61 (or 62) and 66 which are in series connected between power sources Vss and Vcc are not compatible with operation of the current mirror circuit at a low voltage.

A so-called Wilson type current mirror circuit solves this problem. That is, a so-called Wilson type current mirror circuit includes transistors electrically connected in series to each other, but can operate at a low voltage.

An example of a Wilson type current mirror circuit is illustrated in FIG. 3.

The illustrated Wilson type current mirror circuit is comprised of a first PNP transistor 67, a second PNP transistor 68 having a base electrically connected to a base of the first PNP transistor 67, a third PNP transistor 69 having an emitter electrically connected to a collector of the first PNP transistor 67, a fourth PNP transistor 70 having a base electrically connected to a base of the third PNP transistor 69 and an emitter electrically connected to a collector of the second PNP transistor 68, and a constant-current source 71 electrically connected to a collector of the third PNP transistor 69. Bases and collectors in both the second and third PNP transistors 68 and 69 are shortcircuited to each other.

The current mirror circuit illustrated in FIG. 3 can provide a higher current conversion efficiency than the same in the current mirror circuit illustrated in FIG. 2.

As mentioned above, a current mirror circuit is generally accompanied with a problem that it is quite difficult to satisfy both operation at a low voltage and enhancement in a current conversion efficiency.

Figure 4:
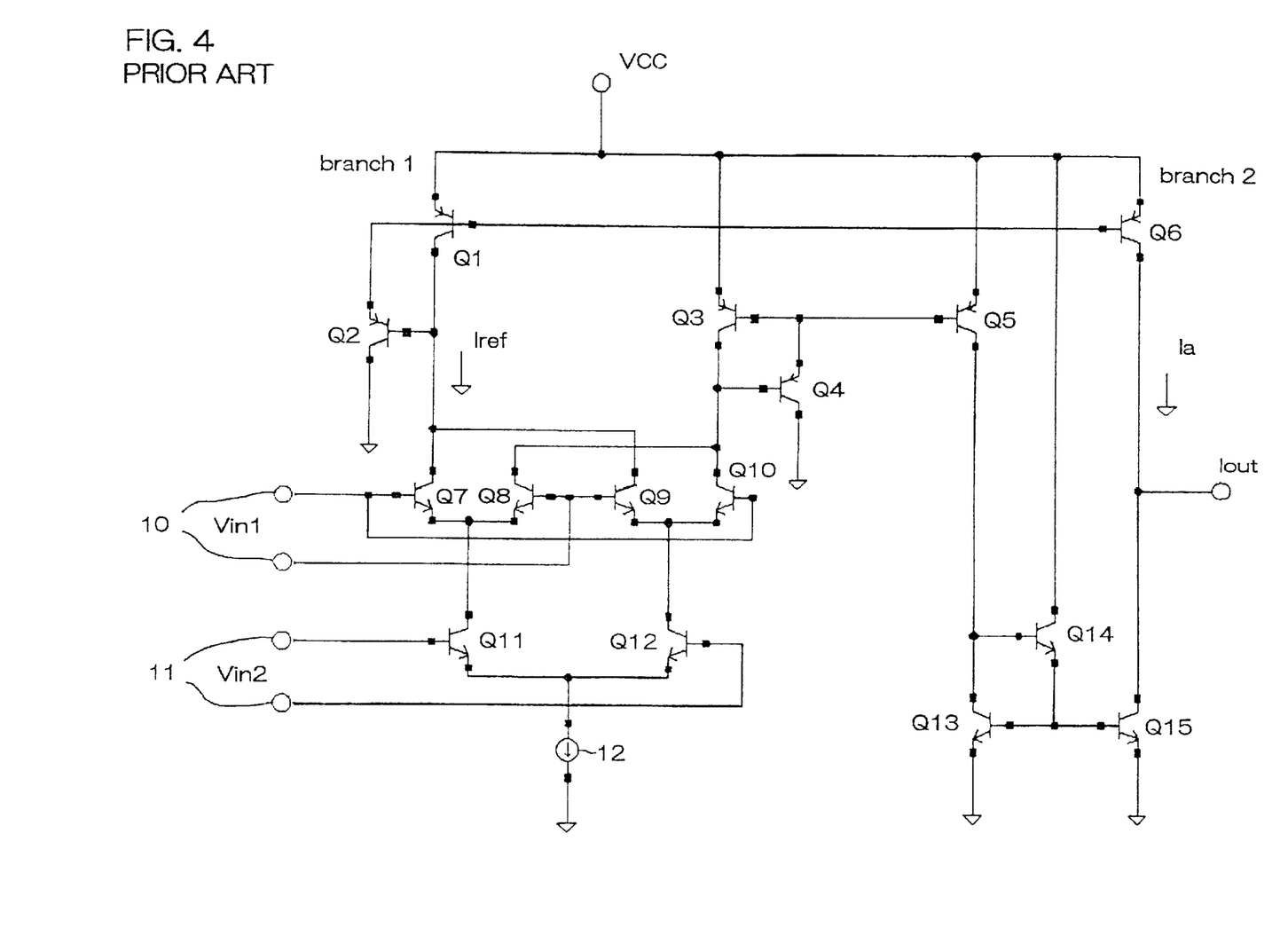
FIG. 4 is a circuit diagram of a conventional phase-comparison circuit.

FIG. 4 is a block diagram of a phase-comparison circuit including a current mirror circuit. A phase-comparison circuit is a circuit for converting two voltage signals input thereto into current signals in accordance with a phase difference between those voltage signals.

A phase-comparison circuit illustrated in FIG. 4 includes first to fifteenth transistors Q1 to Q15.

Two voltage signals Vin1 and Vin2 are input into the phase-comparison circuit through input terminals 10 and 11. The voltage signal Vin1 is applied to bases of the seventh NPN' transistor Q7, the eighth NPN transistor Q8, the ninth NPN transistor Q9, and the tenth NPN transistor Q10. Similarly, the voltage signal Vin2 is applied to bases of the eleventh NPN transistor Q11 and the twelfth NPN transistor Q12.

The first PNP transistor Q1 has an emitter electrically connected to power source voltage Vcc, and a collector electrically connected to a base of the second PNP transistor Q2, a collector of the seventh NPN transistor Q7, and a collector of the ninth NPN transistor Q9. A collector current of the first PNP transistor Q1 is supplied to a collector of the seventh NPN transistor Q7 as a reference current Iref.

The second PNP transistor Q2 has an emitter electrically connected to bases of the first PNP transistor Q1 and the sixth PNP transistor Q6.

Each of the seventh and eighth NPN transistors Q7 and Q8 has an emitter electrically connected to a collector of the eleventh NPN transistor Q11. Each of the ninth and tenth NPN transistors Q9 and Q10 has an emitter electrically connected to a collector of the twelfth NPN transistor Q12. The eleventh and twelfth NPN transistors Q11 and Q12 are electrically connected through emitters thereof to a constant-current source 12.

The third PNP transistor Q3 has an emitter electrically connected to the power source voltage Vcc, a collector electrically connected to a base of the fourth PNP transistor Q4, a collector of the tenth NPN transistor Q10, and a collector of the eighth NPN transistor Q8, and a base electrically connected to both an emitter of the fourth PNP transistor Q4 and a base of the fifth PNP transistor Q5.

The fifth PNP transistor Q5 has an emitter electrically connected to the power source voltage Vcc, and a collector electrically connected to both a base of the fourteenth NPN transistor Q14 and a collector of the thirteenth NPN transistor Q13.

The sixth PNP transistor Q6 has an emitter electrically connected to the power source voltage Vcc, and a collector electrically connected to a collector of the fifteenth NPN transistor Q15.

The fourteenth NPN transistor Q14 has a collector electrically connected to the power source voltage Vcc, and an emitter electrically connected to bases of the thirteenth and fifteenth NPN transistors Q13 and Q15.

The second PNP transistor Q2 is grounded through a collector thereof. The fourth PNP transistor Q4 is grounded through a collector thereof. The thirteenth NPN transistor Q13 is grounded through an emitter thereof. The fifteenth NPN transistor Q15 is grounded through an emitter thereof In the phase-comparison circuit including a current mirror circuit, illustrated in FIG. 4, a collector current in the sixth PNP transistor Q6 is output as an output current Ia.

As mentioned earlier, there is generated a current error or current offset between the reference current Iref and the output current Ia in a current mirror circuit due to a base current. In order to solve this problem, the phase-comparison circuit illustrated in FIG. 4 is provided with the first PNP transistor Q1 for compensating for a base current.

However, the first PNP transistor for compensating for a base current causes another problem that it is necessary to set the power source voltage Vcc at a high level for operating the phase-comparison circuit.

For instance, Japanese Unexamined Patent Publications Nos. 63-164603 and 9-162721 have suggested phase-comparison circuits having the same purpose as that of the phase-comparison circuit illustrated in FIG. 4. These phase-comparison circuits are accompanied with the same problem that the power source voltage Vcc has to be set at a high level.

SUMMARY OF THE INVENTION

In view of the above-mentioned problems, it is an object of the present invention to provide a phase-comparison circuit including a current mirror circuit, which is capable of compensating for a current error between a reference current and an output current, and operating even at a low voltage.

There is provided a phase-comparison circuit including (a) a first transistor having a first polarity, (b) a second transistor having the first polarity, (c) a third transistor electrically connected to both a collector of the first transistor and a base of the second transistor, and having a second polarity, and (d) a constant current source electrically connected to an emitter of the third transistor.

Figure 5:
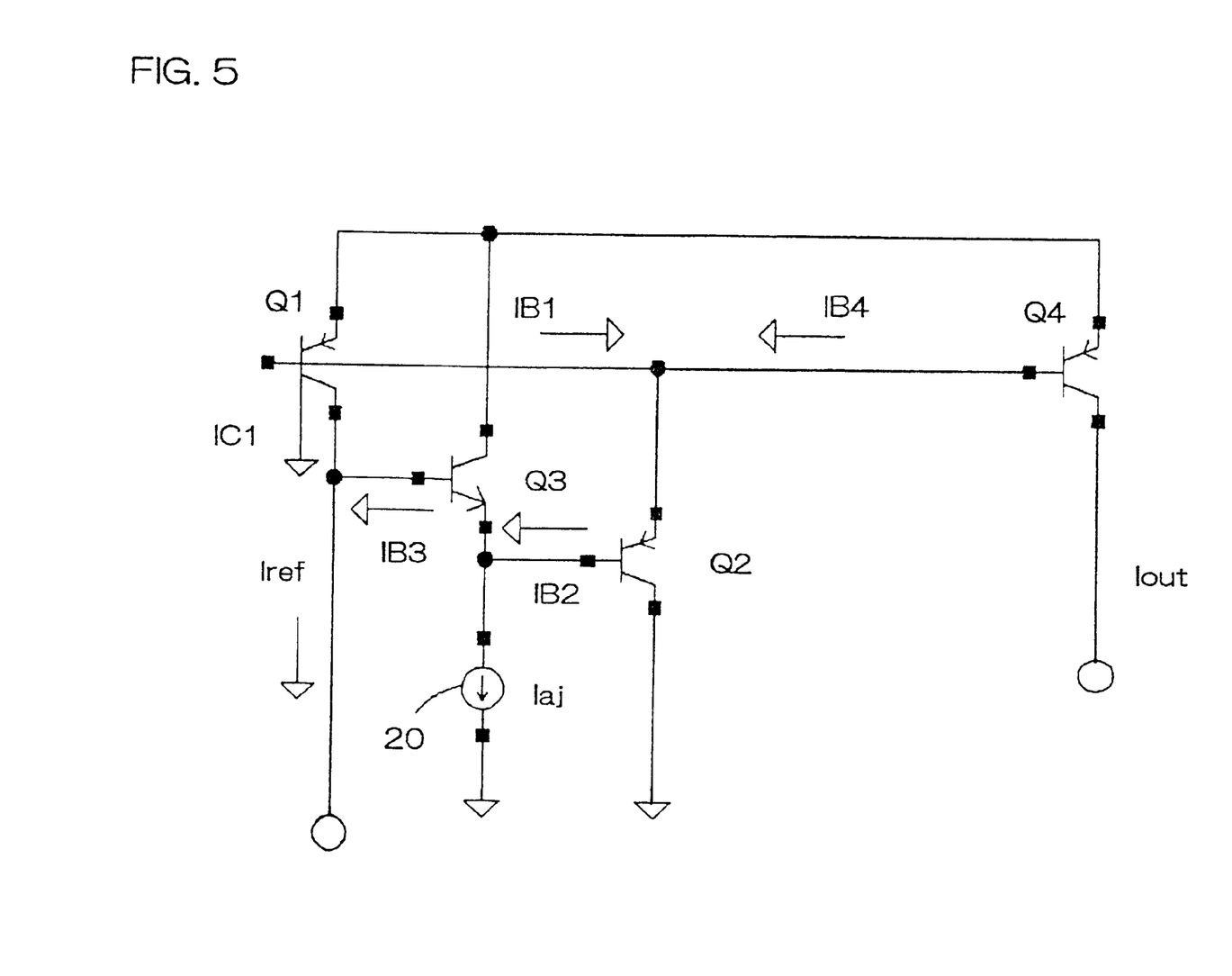
FIG. 5 is a circuit diagram showing the principle of the present invention.

FIG. 5 is a circuit diagram showing a principle of the phase-comparison circuit in accordance with the present invention.

First, hereinbelow is explained the reason why the phase-comparison circuit in accordance with the present invention can operate at a low voltage.

The phase-comparison circuit illustrated in FIG. 5 is comprised of first to fourth transistors Q1 to Q4 and a constant-current source 20.

The first PNP transistor Q1 has a base electrically connected to both an emitter of the second PNP transistor Q2 and a base of the fourth PNP transistor Q4, an emitter electrically connected to both a collector of the third NPN transistor Q3 and an emitter of the fourth PNP transistor Q4, and a collector electrically connected to a base of the third NPN transistor Q3.

The third NPN transistor Q3 has an emitter electrically connected to both a base of the second PNP transistor Q2 and the constant-current source 20.

The second PNP transistor Q2 has a collector which is grounded. A collector current in the first PNP transistor Q1 is output as a reference current, and a collector current in the fourth PNP transistor Q4 is output as an output current Iout.

The first PNP transistor Q1 compensates for a base current.

The phase-comparison circuit illustrated in FIG. 5 is characterized in that the third NPN transistor Q3 and the constant-current source 20 are arranged between a collector of the first PNP transistor Q1 and a base of the second PNP transistor Q2.

In the phase-comparison circuit illustrated in FIG. 5, a voltage $V_{BE}$ between bases and emitters in the first to third transistors Q1 to Q3 is defined as follows.

$$V_{BE} \ VT \ ln \ (Ic/Is)$$

In the equation, Ic indicates a collector current. Accordingly, a collector voltage $V_2$ in the third PNP transistor Q3 is defined as follows.

$$V_2 = VCC - V_{BE2} - V_{BE1} + V_{BE3}$$

In the equation, Vcc indicates a power source voltage, and $V_{BE1}$, $V_{BE2}$ and $V_{BE3}$ indicate a voltage across a base and an emitter in the first to third transistors Q1, Q2 and Q3, respectively.

For instance, it is now assumed that voltages across bases and emitters in the first to third transistors Q1 to Q3 are all equal to one another, that is, $V_{BE1} = V_{BE2} = V_{BE3} = V_{BE}$, the collector voltage $V_2$ in the third PNP transistor Q3 is represented as follows.

$$V_2 = VCC - V_{BE}$$

$$\therefore VCC = V_2 + V_{BE}$$

This equation is equivalent to that a base and a collector in the third NPN transistor Q3 are shortcircuited to each other.

In the conventional phase-comparison circuit illustrated in FIG. 4, since a collector voltage V2 in the third NPN transistor Q3 is defined as follows by adding the first PNP transistor Q1 for compensating for a base current, to the phase-comparison circuit, it is necessary to set a power source voltage Vcc at a high level.

$$V_2 = VCC - 2V_{BE}$$

$$\therefore Vcc = V_2 + 2V_{BE}$$

In contrast, the phase-comparison circuit in accordance with the present invention makes it possible to reduce the power source voltage Vcc by a voltage $V_{BE}$ which is a voltage between a base and an emitter in the third NPN transistor Q3.

Hereinbelow is explained the reason why the phase-comparison circuit in accordance with the present invention can compensate for an output offset current.

In the conventional phase-comparison circuit illustrated in FIG. 4, a relation between a reference current Iref in branch 1, that is, a collector current in the first PNP transistor, and an output current Ia in branch 2, that is, a collector current in the sixth PNP transistor is represented in the following equation.

$$Ia = Iref/(1 + 2/hFE \ (hFE + 1))$$

Accordingly, there is produced an error $hFE^2$ between the reference current Iref and the output current Ia. In the equation, hFE indicates a forward current gain in a PNP transistor.

In contrast, the following equations are established in the phase-comparison circuit in accordance with the present invention, illustrated in FIG. 5.

$$Iref = IC1 - IB3$$

$$IC1 = IB1 \times HFE$$

$$Iout = IB4 \times HFE$$

$$IB1 + IB4 = (HFE+1) \times IB2$$

$$Iaj = IB2 + IB3(hFE+1)$$

In the above-mentioned equations, HFE indicates a current amplification factor in each of PNP transistors, and hFE indicates a current amplification factor in each of NPN transistors.

If the above-mentioned equations are analyzed under a condition that Iref is equal to Iout, (Iref=Iout), the following results are obtained.

$$Iaj = A \times IC1 + B \times Iref \quad (1)$$

$$A = (1 + HFE \ (HFE+1)(hFE+1))/HFE \ (HFE+1)$$

$$B = (1 - HFE \ (HFE+1)(hFE+1))/HFE(HFE+1)$$

Accordingly, it would be possible to compensate for an output offset current by determining the current Iaj such that the equation (1) is established.

As explained so far, the phase-comparison circuit in accordance with the present invention makes it possible to compensate for an offset current between a reference current and an output current, and further to operate even at a low voltage.

There is further provided a phase-comparison circuit including (a) a first transistor having a first polarity, (b) a second transistor having the first polarity, (c) a resistor electrically connected to an emitter of at least one of the first and second transistors, (d) a third transistor electrically connected to both a collector of the first transistor and a base of the second transistor, and having a second polarity, and (e) a constant current source electrically connected to an emitter of the third transistor.

It is possible to maintain an emitter voltage at a predetermined value by electrically connecting at least one of emitters of the first and second transistors to a resistor. This results in reduction in variance in an emitter current, which variance is inherent to a process of fabricating the phase-comparison circuit.

There is still further provided a phase-comparison circuit including (a) a first transistor having a first polarity, (b) a second transistor having the first polarity, (c) a third transistor electrically connected to both a collector of the first transistor and a base of the second transistor, and having a second polarity, (d) a constant-current source electrically connected to an emitter of the third transistor, and (e) a variable constant-current circuit electrically connected to an emitter of the third transistor and detecting a difference between a reference current and a reflected current to thereby feed the thus detected difference back to the constant current source.

The addition of the variable constant-current circuit to the phase-comparison circuit reduces an offset current between a reference current and an output current, and as a result, almost equalizes the reference current to the output current.

Figure 5A:
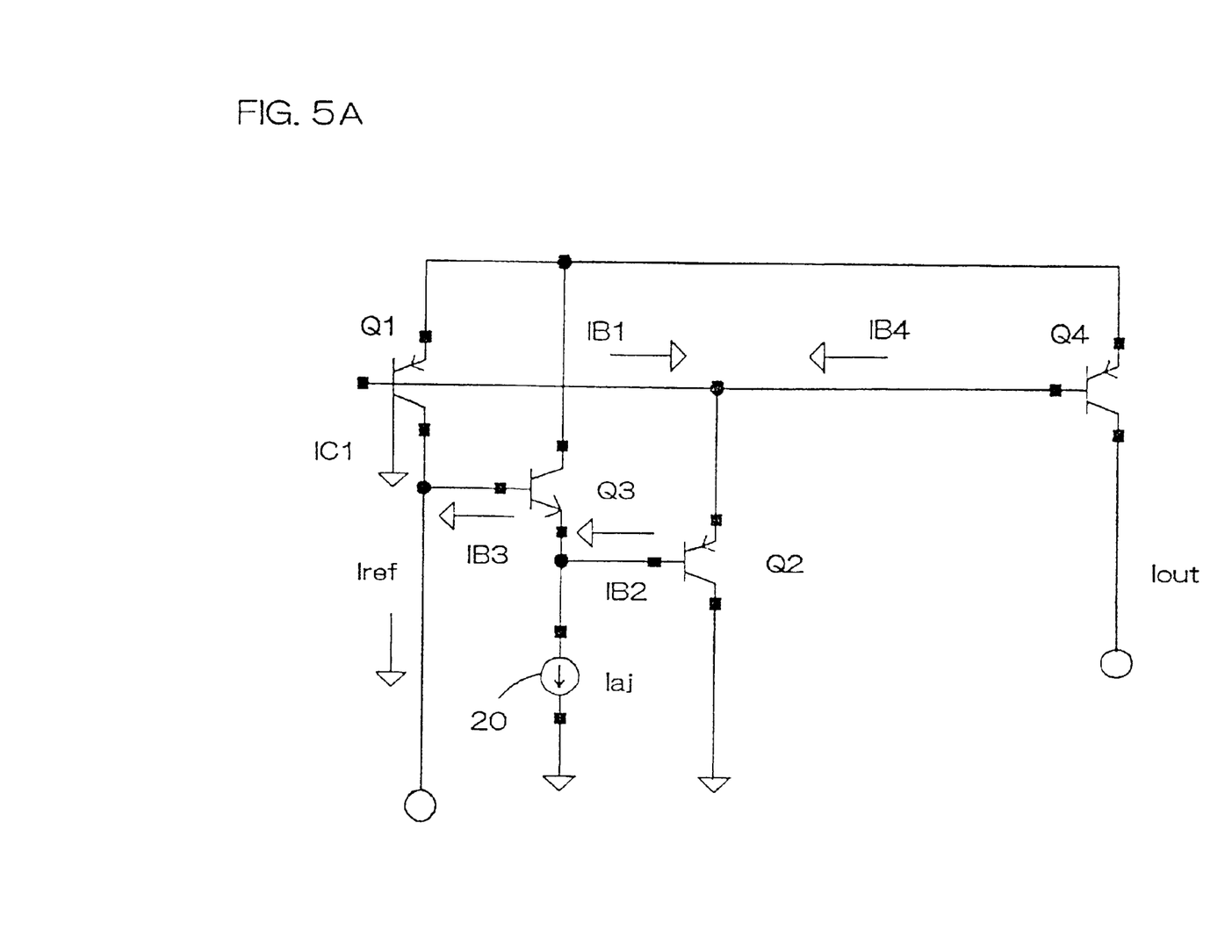
FIG. 5A is a circuit diagram similar to FIG. 5, with the polarity of transistors Q1, Q2 and Q3 reversed.

For instance, the first polarity may be selected as PNP and the second polarity may be selected as NPN. As an alternative, the first polarity may be selected as NPN and the second polarity may be selected as PNP (FIG. 5A).

The advantage obtained by the aforementioned present invention is that an offset current between a reference current and an output current can be compensated for, and the phase-comparison circuit can operate even at a low voltage.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 6:
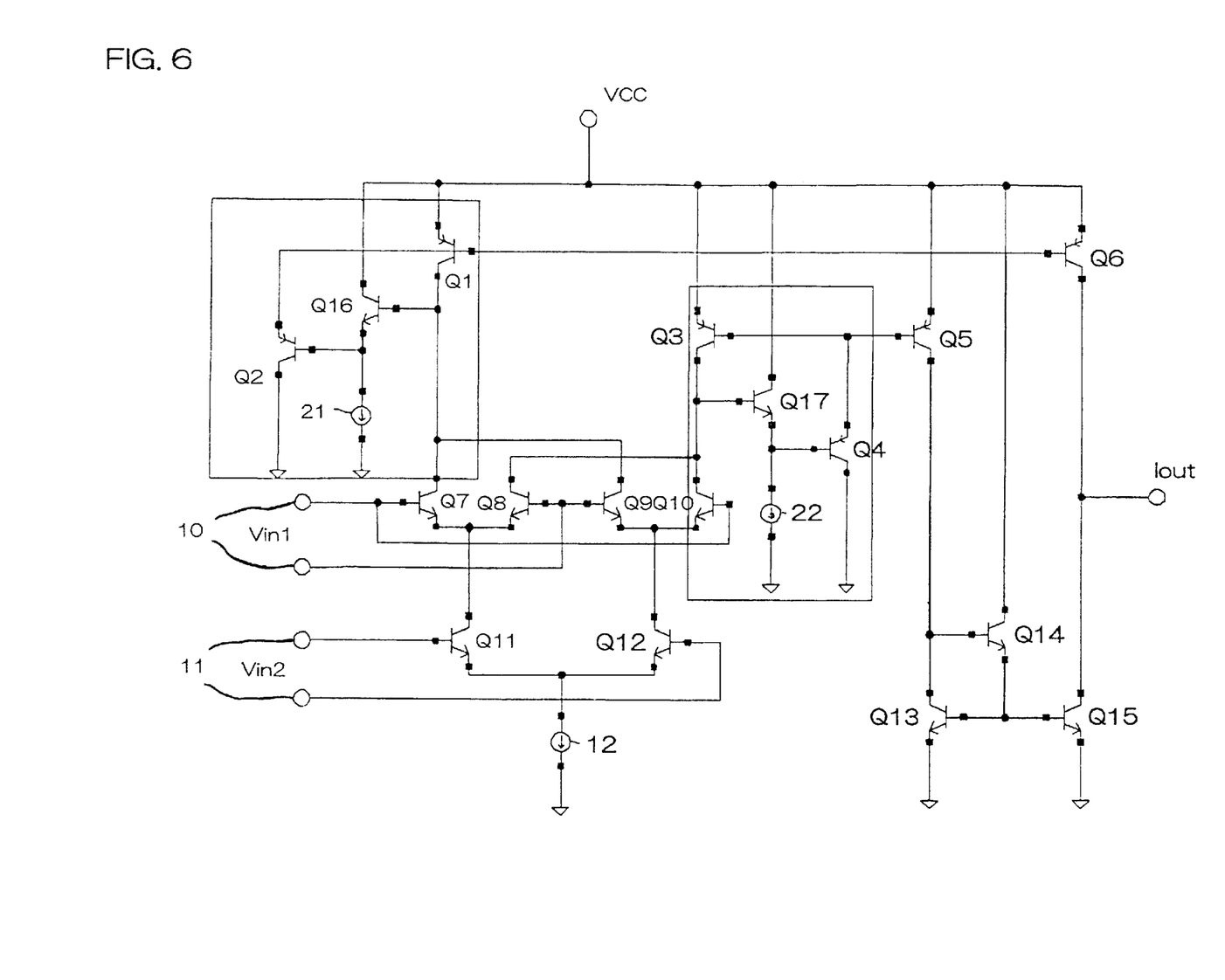
FIG. 6 is a circuit diagram of a phase-comparison circuit in accordance with the first embodiment of the present invention.

FIG. 6 is a circuit diagram of the phase-comparison circuit in accordance with the first embodiment. Parts or elements that correspond to those of the conventional phase-comparison circuit illustrated in FIG. 4 have been provided with the same reference numerals.

In the first embodiment, a sixteenth NPN transistor Q16 and a constant-current source 21 are arranged between a collector of the first PNP transistor Q1 and a base of the second PNP transistor Q2.

A seventeenth NPN transistor Q17 and a constant-current source 22 are arranged between a collector of the third PNP transistor Q3 and a base of the fourth PNP transistor Q4.

The phase-comparison circuit in accordance with the first embodiment has the same structure as the structure of the conventional phase-comparison circuit illustrated in FIG. 4 except that the sixteenth NPN transistor Q16, the constant-current source 21, the seventeenth NPN transistor Q17, and the constant-current source 22 are added.

The phase-comparison circuit in accordance with the first embodiment operates in the same way as the conventional phase-comparison circuit illustrated in FIG. 4. Specifically, the phase-comparison circuit operates as follows.

Two voltage signals Vin1 and Vin2 are input into the phase-comparison circuit through input terminals 10 and 11. These voltage signals Vin1 and Vin2 are converted into current signals in the phase-comparison circuit in accordance with a phase difference between the voltage signals Vin1 and Vin2, and then, output as output current Iout.

As mentioned earlier, the phase-comparison circuit in accordance with the first embodiment can operate even at a low voltage, and compensate for an offset current.

Second Embodiment

Figure 7:
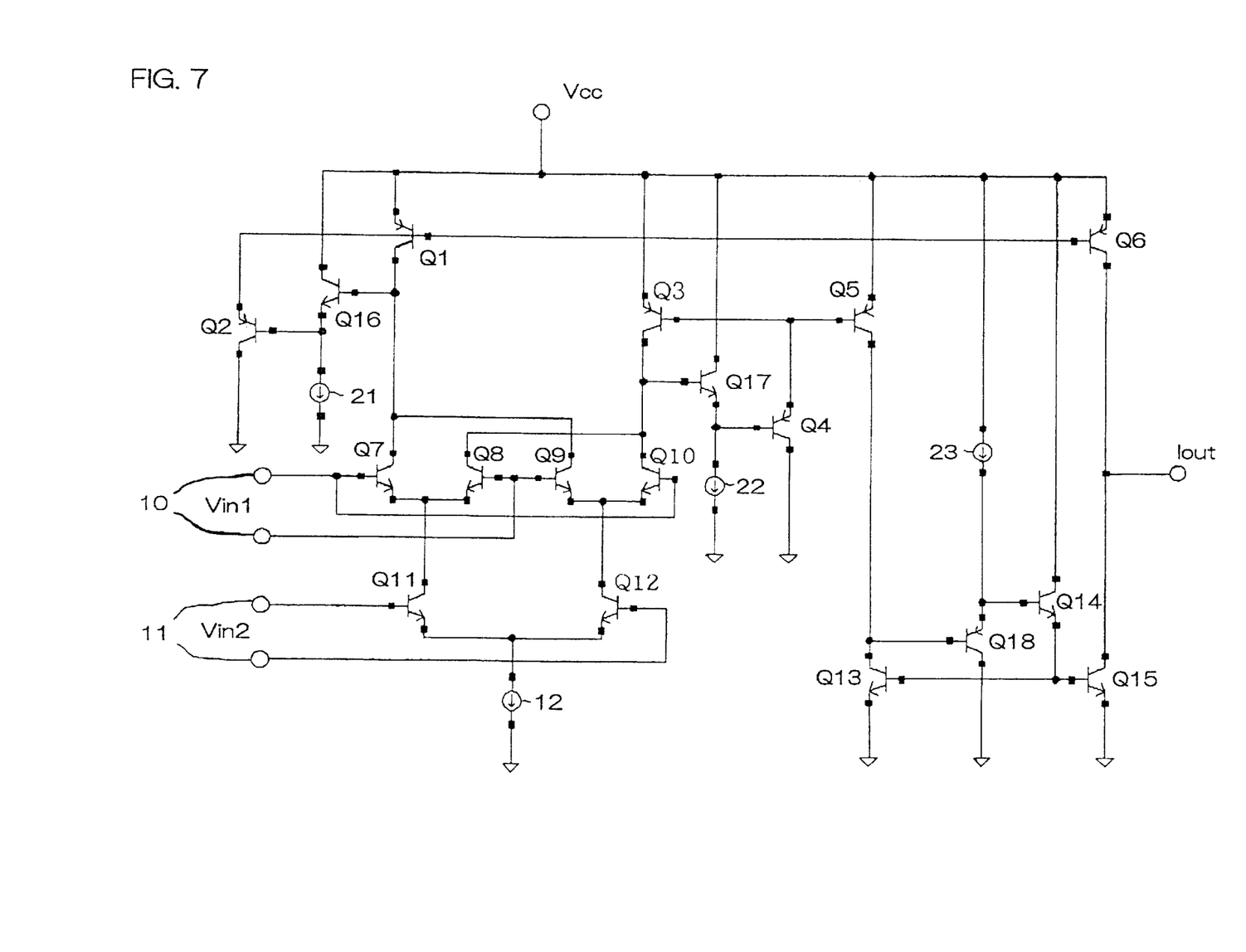
FIG. 7 is a circuit diagram of a phase-comparison circuit in accordance with the second embodiment of the present invention.

FIG. 7 is a circuit diagram of the phase-comparison circuit in accordance with the second embodiment. Parts or elements that correspond to those of the phase-comparison circuit illustrated in FIG. 6 have been provided with the same reference numerals.

In the second embodiment, an eighteenth PNP transistor Q18 and a constant-current source 23 are arranged between a collector of the thirteenth NPN transistor Q13 and a base of the fourteenth NPN transistor Q14.

The phase-comparison circuit in accordance with the second embodiment has the same structure as the structure of the phase-comparison circuit in accordance with the first embodiment, illustrated in FIG. 6, except that the phase-comparison circuit in accordance with the second embodiment is provided further with the eighteenth PNP transistor Q18 and the constant-current source 23.

The phase-comparison circuit in accordance with the second embodiment operates in the same way as the phase-comparison circuit in accordance with the first embodiment.

The phase-comparison circuit in accordance with the second embodiment can compensate for a current offset to a greater degree than the first embodiment.

Third Embodiment

Figure 8:
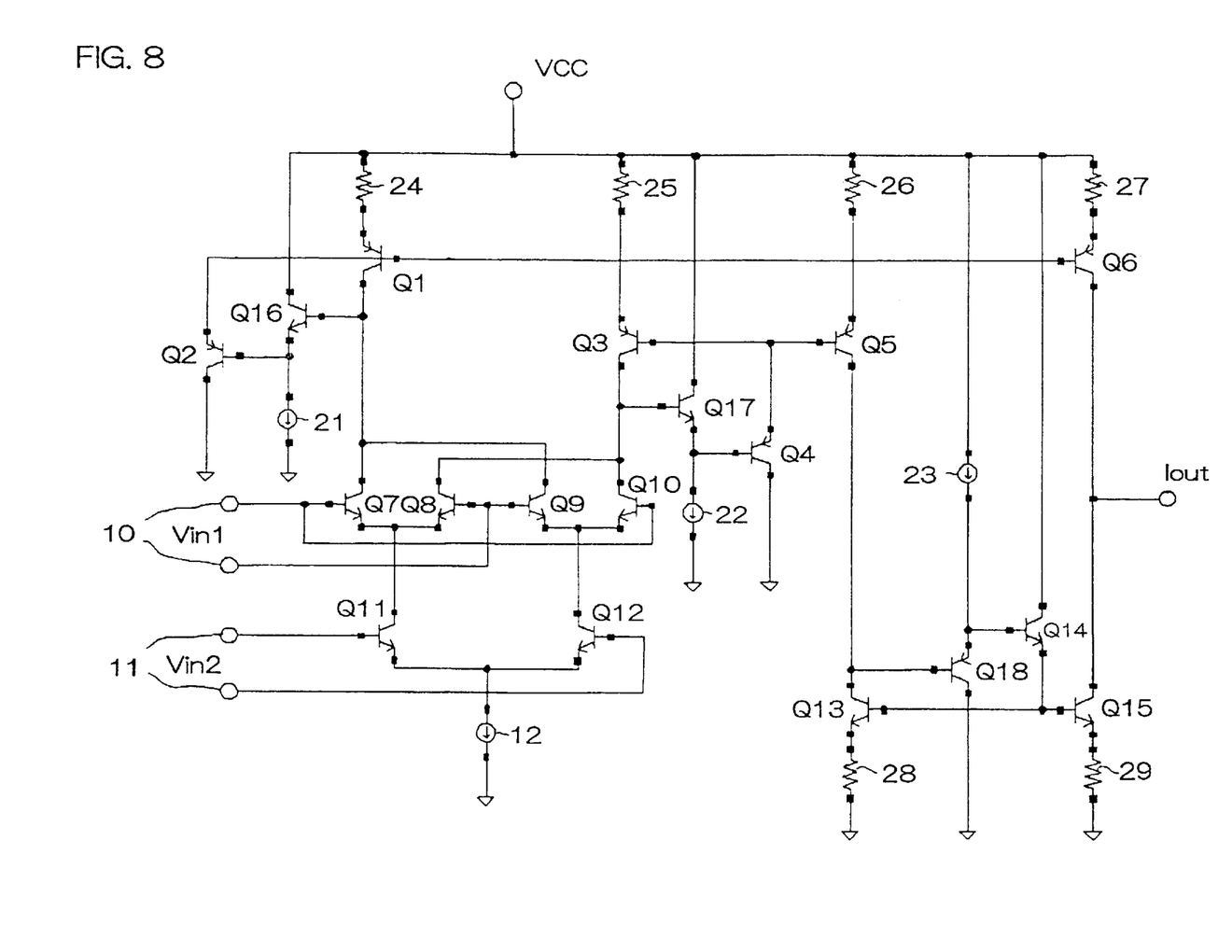
FIG. 8 is a circuit diagram of a phase-comparison circuit in accordance with the third embodiment of the present invention.

FIG. 8 is a circuit diagram of the phase-comparison circuit in accordance with the third embodiment. Parts or elements that correspond to those of the phase-comparison circuit illustrated in FIG. 7 have been provided with the same reference numerals.

In the third embodiment, resistors 24, 25, 26, 27, 28 and 29 are electrically connected in series to emitters of the first PNP transistor Q1, the third PNP transistor Q3, the fifth PNP transistor Q5, the sixth PNP transistor Q6, the thirteenth NPN transistor Q13, and the fifth NPN transistor Q15, respectively.

The phase-comparison circuit in accordance with the third embodiment has the same structure as the structure of the phase-comparison circuit in accordance with the second embodiment, illustrated in FIG. 7, except that the phase-comparison circuit in accordance with the third embodiment is provided further with the resistors 24 to 29.

The phase-comparison circuit in accordance with the third embodiment operates in the same way as the phase-comparison circuit in accordance with the first embodiment.

The phase-comparison circuit in accordance with the third embodiment makes it possible to maintain an emitter voltage at a predetermined voltage, ensuring reduction in variance in an emitter current, which variance is inherent to a process of fabricating the phase-comparison circuit.

Fourth Embodiment

Figure 9:
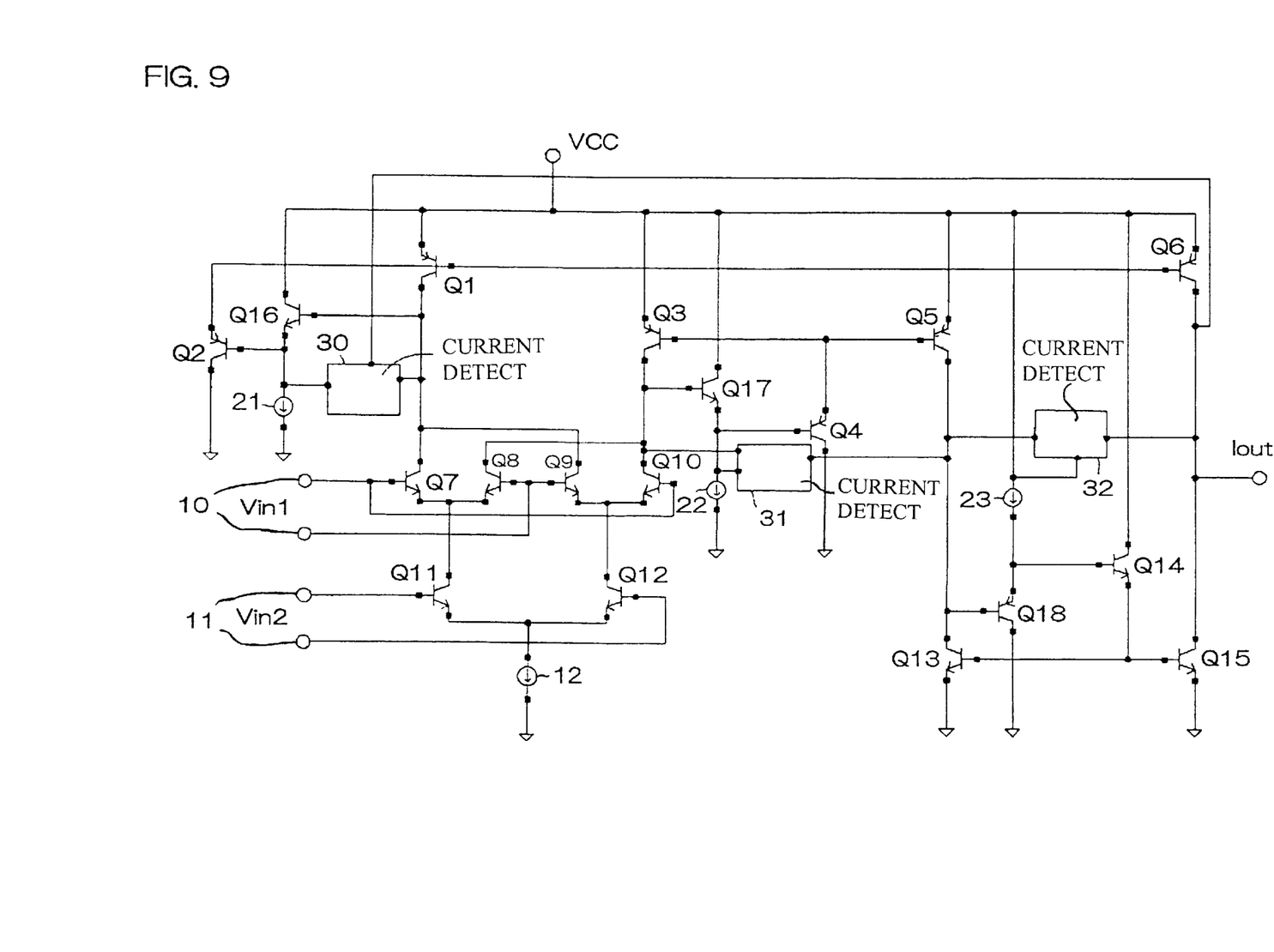
FIG. 9 is a circuit diagram of a phase-comparison circuit in accordance with the fourth embodiment of the present invention.

FIG. 9 is a circuit diagram of the phase-comparison circuit in accordance with the fourth embodiment. Parts or elements that correspond to those of the phase-comparison circuit illustrated in FIG. 7 have been provided with the same reference numerals.

The phase-comparison circuit in accordance with the fourth embodiment is provided with first to third current detectors 30, 31 and 32.

The first current detector 30 is electrically connected to a collector of the first PNP transistor Q1, a collector of the seventh NPN transistor Q7, a collector of the sixth PNP transistor Q6, a collector of the fifteenth NPN transistor Q15, an emitter of the sixteenth NPN transistor Q15, a base of the second PNP transistor Q2, and a constant-current detector 21. The first current detector 30 detects a difference between a reference current and a reflected current, and feeds the thus detected difference back to the constant-current source 21.

The second current detector 31 is electrically connected to a collector of the third PNP transistor Q3, a collector of the tenth NPN transistor Q10, a base of the seventeenth PNP transistor Q17, a collector of the eighth NPN transistor Q8, a collector of the fifth PNP transistor Q5, a collector of the thirteenth NPN transistor Q13, a base of the eighteenth PNP transistor Q18, an emitter of the seventeenth NPN transistor Q17 and a constant-current detector 22. The second current detector 31 detects a difference between a reference current and a reflected current, and feeds the thus detected difference back to the constant-current source 22.

The third current detector 32 is electrically connected to a collector of the fifth PNP transistor Q5, a collector of the thirteenth NPN transistor Q13, a base of the eighteenth PNP transistor Q18, a collector of the sixth PNP transistor Q6, a collector of the fifteenth NPN transistor Q15, an emitter of the eighteenth PNP transistor Q18, a base of the fourteenth NPN transistor Q14, and a constant-current detector 23. The third current detector 32 detects a difference between a reference current and a reflected current, and feeds the thus detected difference back to the constant-current source 23.

The phase-comparison circuit in accordance with the fourth embodiment has the same structure as the structure of the phase-comparison circuit in accordance with the second embodiment, illustrated in FIG. 7, except that the phase-comparison circuit in accordance with the fourth embodiment is provided further with the current detectors 30, 31 and 32.

The phase-comparison circuit in accordance with the fourth embodiment operates in the same way as the phase-comparison circuit in accordance with the first embodiment.

The phase-comparison circuit in accordance with the fourth embodiment feeds the detected current difference back to the constant-current sources 21, 22 and 23 to thereby adjust an emitter current Iaj of the sixteenth PNP transistor Q16, an emitter current of the seventeenth PNP transistor Q17, and a collector current Iaj of the eighteenth PNP transistor Q18. As a result, the phase-comparison circuit in accordance with the fourth embodiment can compensate for an output current offset to a greater degree than the second embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-12728 filed on Jan. 21, 1999 including specification, claims, drawings and summary is incorporated herein by reference in its entirety.

What is claimed is:

1. A phase-comparison circuit for comparing a phase difference between a first and a second input signal comprising:

an input stage configured to receive said first and second input signals, and configured to deliver a reference signal representative of the phase difference between said first and second input signals; and a current circuit configured to receive said reference signal and deliver an output signal of said phase-comparison circuit representing said phase difference between said first and second input signals;

said current circuit comprising a first transistor having a first polarity, a second transistor having said first polarity, a third transistor having a second polarity, and having its base coupled to a collector of said first transistor and having its emitter coupled to a base of said second transistor, and a current source coupled to an emitter of said third transistor.

2. The phase-comparison circuit according to claim 1, wherein said first polarity is PNP and said second polarity is NPN.

3. The phase-comparison circuit according to claim 1, wherein said first polarity is NPN and said second polarity is PNP.

4. A phase-comparison circuit for comparing a phase difference between a first and a second input signal comprising:

an input stage configured to receive said first and second input signals, and configured to deliver a reference signal representative of the phase difference between said first and second input signals; and a current circuit configured to receive said reference signal and deliver an output signal of said phase-comparison circuit representing said phase difference between said first and second input signals;

said current circuit comprising a first transistor having a first polarity, a second transistor having said first polarity, a resistor coupled to an emitter of at least one of said first and second transistors, a third transistor having a second polarity, and having its base coupled to a collector of said first transistor and having its emitter coupled to a base of said second transistor, and a current source coupled to an emitter of said third transistor.

5. The phase-comparison circuit according to claim 4, wherein said first polarity is PNP and said second polarity is NPN.

6. The phase-comparison circuit according to claim 4, wherein said first polarity is NPN and said second polarity is PNP.

7. A phase-comparison circuit for comparing a phase difference between a first and a second input signal comprising:

an input stage configured to receive said first and second input signals, and configured to deliver a reference signal representative of the phase difference between said first and second input signals; and a current circuit configured to receive said reference signal and deliver an output signal of said phase-comparison circuit representing said phase difference between said first and second input signals;

said current circuit comprising a first transistor having a first polarity, a second transistor having said first polarity, a third transistor having a second polarity, and having its base coupled to a collector of said first transistor and having its emitter coupled to a base of said second transistor, a current source coupled to an emitter of said third transistor, and a variable-current circuit connected to the emitter of said third transistor to detect a difference between a reference current of said reference signal and a reflected current of said output signal to thereby feed the detected difference back to said current source.

8. The phase-comparison circuit according to claim 7, wherein said first polarity is PNP and said second polarity is NPN.

9. The phase-comparison circuit according to claim 7, wherein said first polarity is NPN and said second polarity is PNP.

* * * * *